US007944083B2

(12) United States Patent
Fornage et al.

(10) Patent No.: US 7,944,083 B2
(45) Date of Patent: May 17, 2011

(54) METHOD AND APPARATUS FOR CHARACTERIZING A CIRCUIT COUPLED TO AN AC LINE

(75) Inventors: Martin Fornage, Petaluma, CA (US); Marv Dargatz, Auburn, CA (US)

(73) Assignee: Enphase Energy, Inc., Petaluma, CA (US)

( * ) Notice: Subject to any disclaimer, the term of this patent is extended or adjusted under 35 U.S.C. 154(b) by 0 days.

(21) Appl. No.: 12/657,447

(22) Filed: Jan. 21, 2010

(65) Prior Publication Data
US 2010/0181830 A1    Jul. 22, 2010

Related U.S. Application Data

(60) Provisional application No. 61/205,589, filed on Jan. 21, 2009.

(51) Int. Cl.
*H02J 3/06*    (2006.01)
(52) U.S. Cl. ........................................................ 307/19
(58) Field of Classification Search ..................... 307/19
See application file for complete search history.

(56) References Cited

U.S. PATENT DOCUMENTS

| | | | |
|---|---|---|---|
| 5,600,526 | A | 2/1997 | Russell et al. |
| 5,627,718 | A | 5/1997 | Engel et al. |
| 2003/0023884 | A1 | 1/2003 | See et al. |
| 2008/0130182 | A1 | 6/2008 | Anderson et al. |

OTHER PUBLICATIONS

UL-1741.1 "Inverters, Converters, Controllers and Interconnection System Equipment for Use With Distributed Energy Resources", downloaded from web site http://ulstandardsinfonet.ul.com/scopes/1741.html, on Jun. 11, 2008.
IEEE std 1547-2003, "IEEE Standard for Interconnecting Distributed Resources with Electric Power Systems", Standards Coordinating Committee 21, dated Jul. 28, 2003, pp. 1-16.
IEEE Std 929-2000, "IEEE Recommended Practice for Utility Interface of Photovoltaic (PV) Systems", IEEE Standards Coordinating Committee 21, dated Jan. 30, 2000, pp. 1-26.
"Performance Test Protocol for Evaluating Inverters Used in Grid-Connected Photovoltaic Systems", Ward Bower et al., dated Oct. 2004, pp. 1-41.
International Search Report and Written Opinion dated Aug. 30, 2010 for PCT Application No. PCT/US2010/021643.

*Primary Examiner* — Jared J Fureman
*Assistant Examiner* — Dru M Parries
(74) *Attorney, Agent, or Firm* — Moser IP Law Group

(57) ABSTRACT

A method and apparatus for characterizing a circuit coupled to an AC line. The apparatus comprises a consumption measurement unit (CMU), adapted for coupling, independent of voltage and current polarity, to the AC line and the circuit. The CMU comprises a discovery module adapted for (i) generating a circuit current signature based on current samples representative of current on a phase of the circuit, (ii) generating at least one AC line current signature based on AC line current samples representative of current on each phase of the AC line, and (iii) determining, based on the circuit current signature, the at least one AC line current signature, and at least one of a source profile or a load profile, at least one of a type or a voltage characteristic for the circuit.

20 Claims, 5 Drawing Sheets

US 7,944,083 B2

METHOD AND APPARATUS FOR CHARACTERIZING A CIRCUIT COUPLED TO AN AC LINE

CROSS-REFERENCE TO RELATED APPLICATIONS

This application claims benefit of U.S. provisional patent application Ser. No. 61/205,589, filed Jan. 21, 2009, which is herein incorporated in its entirety by reference.

BACKGROUND OF THE INVENTION

1. Field of the Invention

Embodiments of the present disclosure generally relate to power systems and, more particularly, to a method and apparatus for characterizing a circuit coupled to an AC line.

2. Description of the Related Art

Solar panels have historically been deployed in mostly remote applications, such as remote cabins in the wilderness or satellites, where commercial power was not available. Due to the high cost of installation, solar panels were not an economical choice for generating power unless no other power options were available. However, the worldwide growth of energy demand is leading to a durable increase in energy cost. In addition, it is now well established that the fossil energy reserves currently being used to generate electricity are rapidly being depleted. These growing impediments to conventional commercial power generation make solar panels a more attractive option to pursue.

Solar panels, or photovoltaic (PV) modules, convert energy from sunlight received into direct current (DC). The PV modules cannot store the electrical energy they produce, so the energy must either be dispersed to an energy storage system, such as a battery or pumped hydroelectricity storage, or dispersed by a load. One option to use the energy produced is to employ inverters to convert the DC current into an alternating current (AC) and couple the AC current to the commercial power grid. The power produced by such a distributed generation (DG) system can then be sold to the commercial power company.

In order to mitigate potential safety hazards, a DG coupled to a commercial power grid must be operated in accordance with relevant regulatory requirements, such as IEEE-1547. As part of meeting the IEEE-1547 requirements, an inverter within a DG must shut down under certain circumstances, including line frequency or line voltage operating outside of pre-defined limits. The IEEE-1547 standard specifies that such voltage requirements must be met at a Point of Common Coupling (PCC) between the commercial power system and the DG (i.e., a point of demarcation between the public utility service and the DG).

In cases where a DG is located some distance from the PCC, electrical power data acquisition equipment must be installed at the PCC to monitor the relevant electrical parameters. Installing the data acquisition equipment requires manually intensive work to ensure that voltage sense leads and current sensors of the acquisition equipment are connected to the appropriate leads and have the proper orientation. Additionally, identification of a circuit type as a load or a source and determination of circuit voltage characteristics (e.g., single phase, split phase) must be manually performed. Proper installation of the data acquisition equipment is critical to provide accurate monitoring of the electrical data; improperly connected data acquisition equipment could result in invalid data and therefore present a potential safety hazard.

Therefore, there is a need for a method and apparatus for automatically determining characteristics of a circuit coupled to an AC line.

SUMMARY OF THE INVENTION

Embodiments of the present invention generally relate to a method and apparatus for characterizing a circuit coupled to an AC line. The apparatus comprises a consumption measurement unit (CMU), adapted for coupling, independent of voltage and current polarity, to the AC line and the circuit. The CMU comprises a discovery module adapted for (i) generating a circuit current signature based on current samples representative of current on a phase of the circuit, (ii) generating at least one AC line current signature based on AC line current samples representative of current on each phase of the AC line, and (iii) determining, based on the circuit current signature, the at least one AC line current signature, and at least one of a source profile or a load profile, at least one of a type or a voltage characteristic for the circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
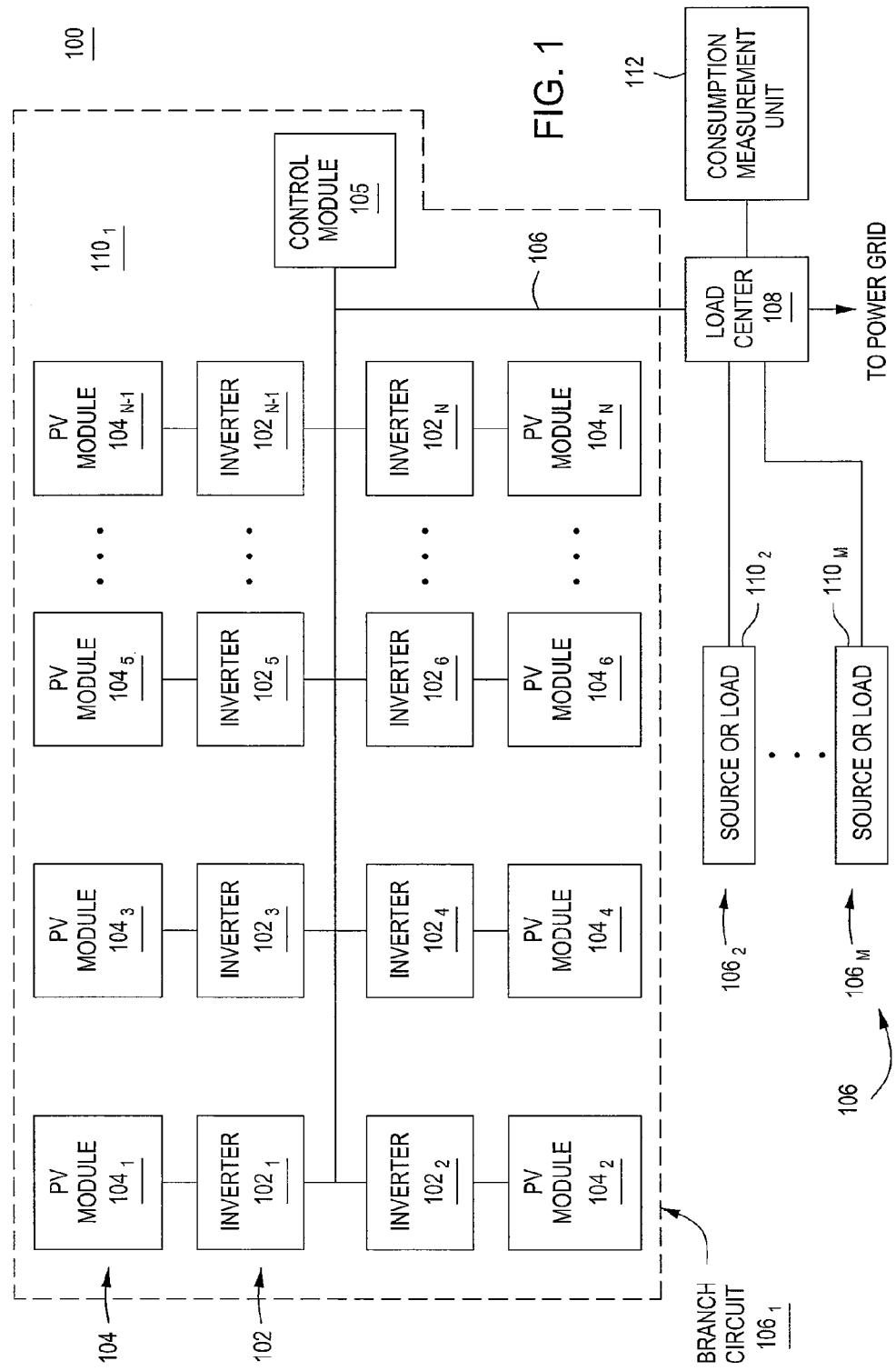
FIG. 1 is a block diagram of a power user's system in accordance with one or more embodiments of the present invention.

FIG. 1 is a block diagram of a power user's system 100 in accordance with one or more embodiments of the present invention. This diagram only portrays one variation of the myriad of possible system configurations. The present invention can function in a variety of distributed power generation environments and systems.

The system 100 comprises a plurality of branch circuits $106_1, 106_2 \ldots 106_m$, collectively referred to as branch circuits 106, coupled to a load center 108. The load center 108 houses connections between incoming power lines from a commercial power grid distribution system and the branch circuits 106. Each branch circuit $106_1, 106_2 \ldots 106_m$ comprises a current source (e.g., a generator) or a load (e.g., an electrical appliance) $110_1, 110_2 \ldots 110_m$.

In some embodiments, a branch circuit $106_1$ comprises a solar distributed generator (DG) acting as a source. The solar DG comprises a plurality of inverters $102_1, 102_2 \ldots 102_n$, collectively referred to as inverters 102, and a plurality of PV modules $104_1, 104_2 \ldots 104_n$, collectively referred to as PV modules 104. Each inverter $102_1, 102_2 \ldots 102_n$, is coupled in a one-to-one correspondence to a PV module $104_1, 104_2 \ldots 104_n$, respectively. In some embodiments, a DC-DC converter may be coupled between each PV module 104 and each inverter 102 (e.g., one converter per PV module 104). Alternatively, multiple PV modules 104 may be coupled to a single inverter 102 (i.e., a centralized inverter); in some embodiments, a DC-DC converter may be coupled between the PV modules 104 and the centralized inverter.

The inverters 102 are coupled to a control module 105. The control module 105 may provide operations and maintenance functions, such as providing operative control of the inverters 102, monitoring of and/or data collection from the inverters 102, and the like. Additionally or alternatively, the control module 105 may act as a communications gateway to the inverters 102, for example, transmitting information between the inverters 102 and a separate facility. The control module 105 may use communications techniques, such as power line communication (PLC), other types of wired techniques, and/or wireless techniques, for communicating with the inverters 102 and/or other elements within or outside of the system 100.

The inverters 102 convert DC power generated by the PV modules 104 into AC power, and meter out AC current that is in-phase with the AC commercial power grid voltage. The system 100 couples the generated AC power to the commercial power grid via the load center 108. Additionally or alternatively, power may be coupled to appliances, and/or generated energy may be stored for later use; for example, the generated energy may be stored utilizing batteries, heated water, hydro pumping, $H_2O$-to-hydrogen conversion, or the like. In some alternative embodiments, the branch circuit $106_1$ and/or other branch circuits 106 may comprise solar DGs and/or alternative types of DGs, such as wind turbines, hydroelectric systems, or the like.

The load center 108 couples a consumption measurement unit (CMU) 112 to the branch circuits 106; in alternative embodiments, the CMU 112 may be coupled to a different location within the system 100. In accordance with one or more embodiments of the present invention, the CMU 112 collects data pertaining to voltage and current levels on each phase of the commercial power grid ("mains voltage" and "mains current", respectively), as well as data pertaining to the current level for each branch circuit 106 ("branch current") at or near a Point of Common Coupling (PCC) between the system 100 and the commercial power grid. Such voltage and current information is then utilized to characterize the branch circuits 106 by correlating changes in the voltage and current levels. Changes in the mains current levels occur directly as a result of source or load activity on one or more of the branch circuits 106; for example, when an appliance is turned on or off, or variation through the day of power generated by the solar DG on branch circuit $106_1$. Changes in current levels each of the branch circuits 106 due to such source or load activity are correlated to the changes in the mains current levels to identify a circuit type (i.e., source or load) as well as voltage characteristics (e.g., single phase, split phase, three phase, mains lines connections, operating voltage, and the like) for each branch circuit 106. Additionally, changes in the mains voltage levels may occur as a result of load or power generation changes on one or more of the branch circuits 106. Such voltage changes, which may be small as compared to the overall voltage level (e.g., a voltage change on the order of one volt), may additionally be correlated to the current changes on the branch circuits 106, for example, for validating a determined circuit type and/or voltage characteristics.

Figure 2:
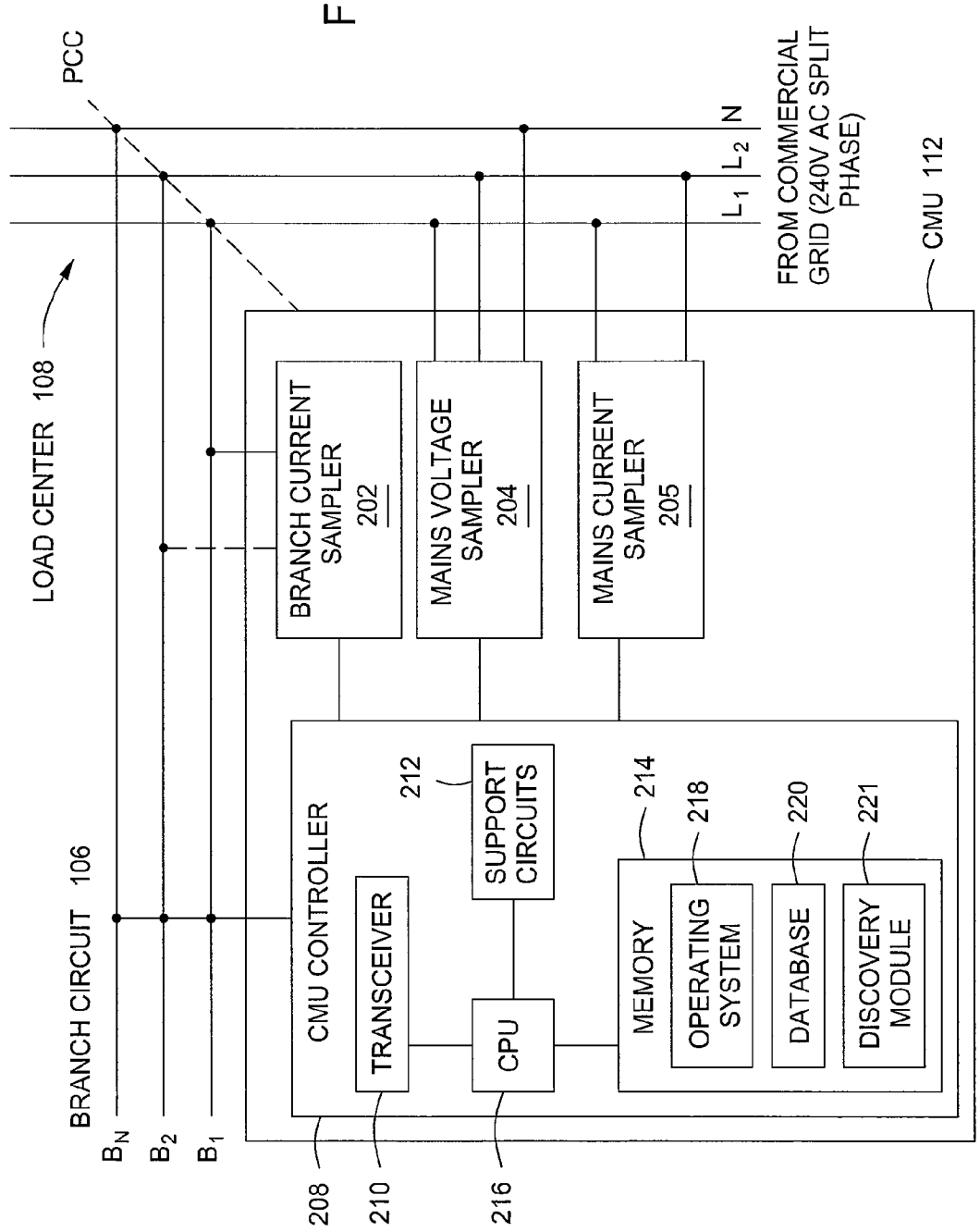
FIG. 2 is a block diagram of a consumption measurement unit (CMU) in accordance with one or more embodiments of the present invention.

FIG. 2 is a block diagram of a CMU 112 in accordance with one or more embodiments of the present invention. The CMU 112 comprises a branch current sampler 202, a mains voltage sampler 204, and a mains current sampler 205, each coupled to a CMU controller 208. The CMU controller 208 comprises a transceiver 210, support circuits 212, and a memory 214, each coupled to a central processing unit (CPU) 216.

The CPU 216 may comprise one or more conventionally available microprocessors. Alternatively, the CPU 216 may include one or more application specific integrated circuits (ASIC). The support circuits 212 are well known circuits used to promote functionality of the CPU 216. Such circuits include, but are not limited to, a cache, power supplies, clock circuits, buses, network cards, input/output (I/O) circuits, and the like.

The memory 214 may comprise random access memory, read only memory, removable disk memory, flash memory, and various combinations of these types of memory. The memory 214 is sometimes referred to as main memory and may, in part, be used as cache memory or buffer memory. The memory 214 generally stores an operating system 218 of the CMU controller 208. The operating system 218 may be one of a number of commercially available operating systems such as, but not limited to, SOLARIS from SUN Microsystems, Inc., AIX from IBM Inc., HP-UX UX from Hewlett Packard Corporation, LINUX from Red Hat Software, Windows 2000 from Microsoft Corporation, and the like.

Additionally, the memory 214 may store various forms of application software, such as a discovery module 221 as a means for performing the steps to determine the circuit type (i.e., load or source) and voltage characteristics (e.g. single phase, split phase, three phase, mains lines connections, operating voltage, and the like) of the branch circuits 106. The memory 214 may also store data in the database 220 related to such processing, including mains voltage signatures, mains current signatures, branch current signatures, load and source profiles, branch current data collected by the branch current sampler 202 (e.g., branch current samples), mains voltage data collected by the mains voltage sampler 204 (e.g., mains voltage samples), and mains current data collected by the mains current sampler 205, (e.g., mains current samples).

The transceiver 210 communicably couples the CMU 112 to the control module 105. In some embodiments, such as the embodiment depicted in FIG. 2, the transceiver 210 is coupled to each branch circuit lines $B_1$, $B_2$, and $B_N$ and communicates with the control module 105 utilizing PLC. In alternative embodiments, the transceiver 210 may be communicably coupled to the control module 105 by a communication network and may utilize wireless and/or wired communication techniques for such communication. In some other embodiments, the transceiver 210 may be communicably coupled to each of the inverters 102, for example via PLC, wired, and/or wireless communication techniques.

In some embodiments, such as the embodiment depicted in FIG. 2, the load center 108 may couple three lines from the commercial power grid to the branch circuit 106, forming a three-wire single-phase distribution system; i.e., mains lines L1, L2, and N may be coupled to branch circuit lines $B_1$, $B_2$, and $B_N$, respectively, where L1 and L2 are live conductors each carrying AC power at different phases and N is a neutral line. In some embodiments, such a power distribution system may be a 240V AC split phase power distribution system;

alternative embodiments may comprise other types of power distribution systems utilizing the same or a different number of power lines, such as a split phase power distribution system at a different voltage, a three-phase power distribution system, a single phase power distribution system, or the like.

In accordance with one or more embodiments of the present invention, the mains voltage sampler 204 is coupled to each of the mains lines L1, L2, and N to measure the voltage for each mains phase (i.e., a line-to-neutral voltage for each phase). The mains voltage sampler 204 generally comprises one or more analog to digital (A/D) converters for generating digital signals representing the measured voltages. The mains current sampler 205 is coupled to the mains lines L1 and L2 (i.e., the live conductors) and measures the current for each mains phase. The mains current sampler 205 generally comprises one or more analog to digital (A/D) converters for generating digital signals representing the measured current. The mains voltage sampler 204 and the mains current sampler 205 may be coupled to the mains lines without regard to orientation of the sampler leads, as subsequent processing is independent of the polarity of the measured voltages and currents.

The branch current sampler 202 is coupled to branch circuit line $B_1$ via a sampling transformer (not shown); alternatively, the branch current sampler 202 may be coupled to the branch circuit line $B_1$ via a current shunt or other means of converting the presence of current into a usable signal. In some alternative embodiments, the branch current sampler 202 may be coupled to any other line of the branch circuit 106; for example, the branch current sampler 202 may be coupled to the branch circuit line $B_2$, as an optional configuration of a single branch current sampler 202 or a combination of two branch current samplers 202. The branch current sampler 202 measures current on the branch circuit 106 and generally comprises an A/D converter for generating digital signals that represent the current. In some embodiments, the branch current sampler 202 may be coupled to a plurality of branch circuits 106 for measuring the current on each branch circuit 106; alternatively, the CMU 112 may comprise additional branch current samplers 202, each branch current sampler 202 coupled to a different branch circuit 106, for measuring the current on a plurality of branch circuits 106. The branch circuit sampler 202 may be coupled to a branch circuit 106 without regard to orientation of the branch current sampler leads, as subsequent processing is independent of the polarity of the measured current.

The mains voltage sampler 204, mains current sampler 205, and branch current sampler 202 generally sample the corresponding voltages and current on a sub-line cycle basis. In some embodiments, where the mains power distribution system operates at 60 Hz, each of the voltages and currents may be sampled at a rate of 3.6 KHz or higher.

The discovery module 221 utilizes the mains voltage samples and the mains current samples to update mains voltage and mains current signatures, respectively, for each of the mains phases, and utilizes the branch current samples to update a branch current signature for the branch circuit 106. Such signatures characterize the mains voltage for each mains phase, the mains current for each mains phase, and the branch circuit current over time. In some embodiments, each of the signatures is periodically updated every few line cycles, such as after every 5-10 line cycles. The discovery module 221 may generate the mains voltage signature, mains current signature, and/or the branch signature over time utilizing sampled voltage and current levels; alternatively, one or more initial signatures may be provided and subsequently updated by the discovery module 221.

The discovery module 221 analyzes the voltage and current signatures for characterizing the branch circuit 106. The discovery module 221 compares the branch current signature to the mains voltage and/or mains current signatures to determine a branch circuit type (i.e., source or load) as well as voltage characteristics of the branch circuit 106 (e.g., single phase, split phase, three phase, mains line connections, operating voltage, and the like), as further described below in relation to FIG. 4.

By automatically determining the circuit type and voltage characteristics of the branch circuits 106, the CMU 112 can accordingly monitor relevant electrical parameters of the branch circuit 106 and the mains lines $L_1$, $L_2$, and N without regard to orientation and polarity of connection to the branch circuit 106 and the mains lines. In some embodiments, data measured by the CMU 112 may be utilized for providing a power factor correction. Additionally or alternatively, current and/or historical information pertaining to power usage and/or generation on a per-branch circuit basis may be provided to users (e.g., a homeowner who owns the system 100) for determining power generation and/or consumption patterns. Such information may be provided, for example, as part of reports generated and sent to the user, via an on-line system that the user may log into, or the like.

Figure 3:
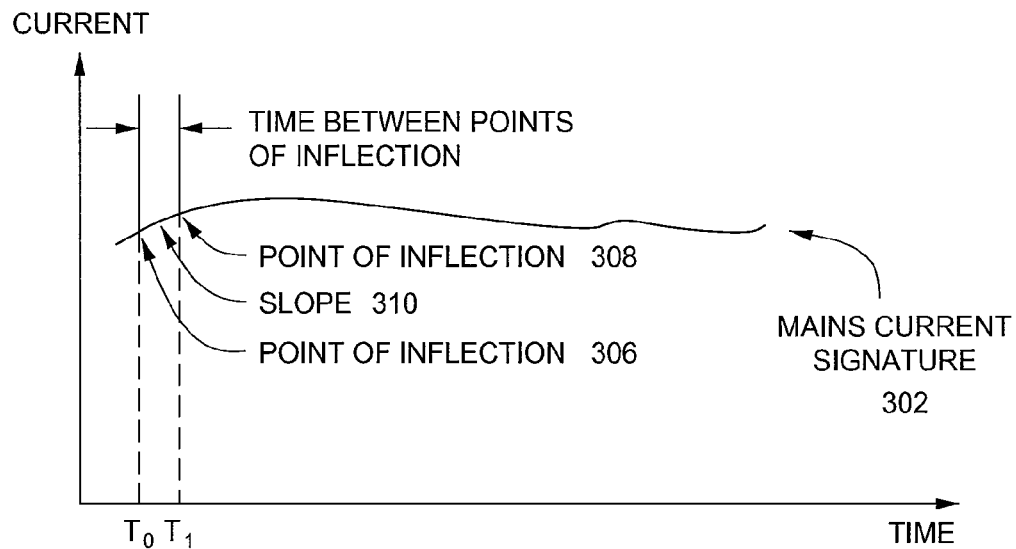
FIG. 3 is a pair of graphical diagrams depicting a mains current signature and a branch current signature in accordance with one or more embodiments of the present invention.
Figure 3:
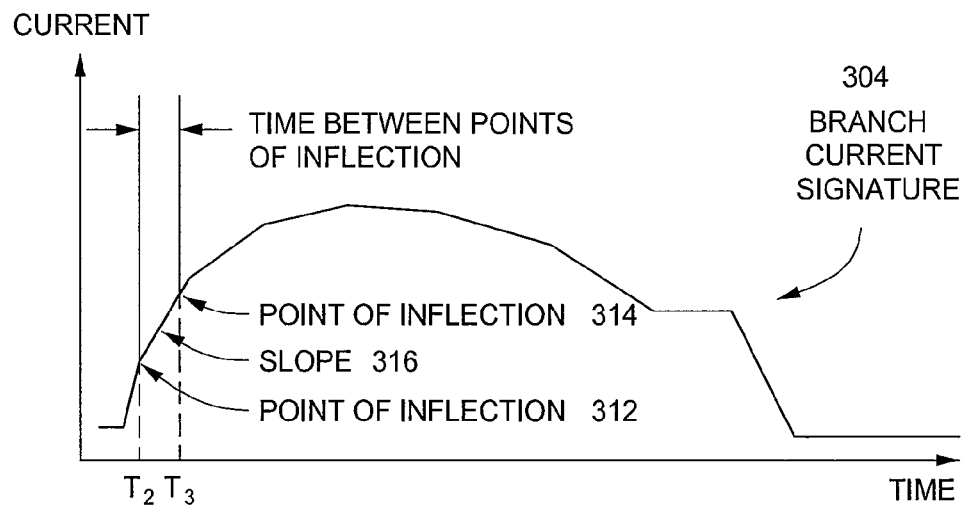

FIG. 3 is a pair of graphical diagrams 300 depicting a mains current signature 302 and a branch current signature 304 in accordance with one or more embodiments of the present invention.

The mains current signature 302 depicts the current measured on one mains phase (shown along the y-axis) over time (shown along the x-axis). Current levels on the mains line fluctuate over time based on current consumption and generation of the branch circuits 106, such as loads coming on and off line, as well as activity of power generators (such as the solar DG on branch circuit $106_1$). At time $T_0$, a first point of inflection 306 on the mains current signature 302 occurs, and at time $T_1$, a second point of inflection 308 on the mains current signature 302 occurs. Such points of inflection may result from, for example, one or more loads coming on or off line on one or more of the branch circuits 106. The mains current signature 302 exhibits a slope 310 between the first and second points of inflection 306 and 308; i.e., the slope 310 is the slope of a straight or nearly straight line between the points of inflection 306 and 308.

The branch current signature 304 depicts the current measured on a particular branch circuit 106 (shown along the y-axis) over time (shown along the x-axis). Current levels on the branch circuit 106 fluctuate over time as a result of load or generator activity on the branch circuit 106. At time $T_2$, a first point of inflection 312 on the branch current signature 304 occurs, and at time $T_3$, a second point of inflection 314 on the branch current signature 304 occurs. Such points of inflection may result from, for example, one or more loads coming on or off line on one or more of the branch circuits 106; for example, an appliance coupled to the branch circuit 106 may be activated and deactivated. The branch current signature 304 exhibits a slope 316 between the first and second points of inflection 312 and 314; i.e., the slope 316 is the slope of a straight or nearly straight line between the points of inflection 312 and 314.

The discovery module 221 determines the points of inflection 306, 308, 312, and 314 for use in determining the circuit type and voltage characteristics of the branch circuit 106. Additionally or alternatively, the discovery module 221 may determine other relevant signature parameters for the mains current signature 302 and the branch current signature 304 for use in characterizing the branch circuit 106. Such relevant signature parameters include at least one of time between points of inflection, slope between points of inflection (e.g., slopes 310 and 316), magnitude between points of inflection, or change in power factor around points of inflection. In some embodiments, analyzing the slope between points of inflection comprises, for example, analyzing sign, amplitude, and/or duration of changed slope, where duration of changed slope may be defined as the time duration of a straight line change in current (i.e., constant slope line) between two points of inflection. Additional and/or alternative parameters may be utilized as well.

Figure 4:
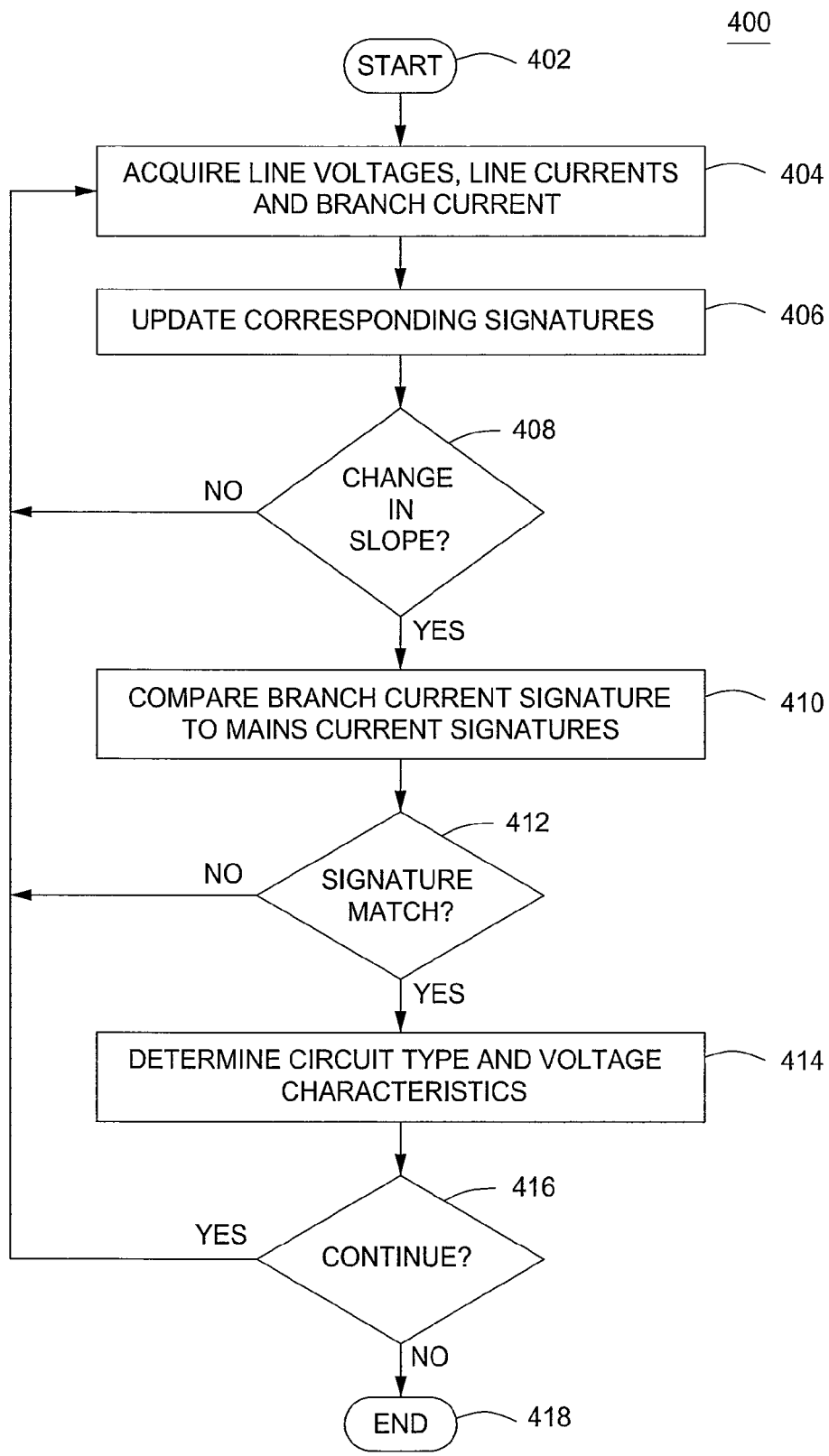
FIG. 4 is a flow diagram of a method for determining branch circuit type and voltage characteristics in accordance with one or more embodiments of the present invention.

FIG. 4 is a flow diagram of a method 400 for determining branch circuit type and voltage characteristics in accordance with one or more embodiments of the present invention. In some embodiments, such as the embodiment described below, one or more branch circuits of a power user's system are coupled to a commercial power grid (i.e., mains lines) at a PCC. Each branch circuit may comprise a load, such as an electrical appliance, or a source, such as a DG for generating AC power and coupling such power to the commercial power grid. A CMU, such as the CMU 112, is coupled at the PCC and obtains and processes relevant electrical parameters for determining the circuit type and voltage characteristics of the power user's branch circuits. Although the method 400 is described below for a single branch circuit, the method 400 may be applied to any and/or all branch circuits of the power user's system. The method 400 may be utilized to characterize a circuit in any type of power distribution system, such as a three-wire single-phase distribution system, a three-phase power distribution system, or the like. Additionally, the method 400 may be utilized to provide an initial configuration of the CMU as well as long term periodic validation of the configuration.

The method 400 begins at step 402 and proceeds to step 404. At step 404, voltage (i.e., line-to-neutral voltage) and current measurements are obtained for each phase of the mains lines, and current measurements are obtained for a single phase of a branch circuit of the power user's system. Generally, such mains voltage samples, mains current samples, and branch current samples are acquired on a continuous basis at regular intervals on a sub-line cycle basis. In some embodiments, where the mains power distribution system operates at 60 Hz, each of the voltage and current samples may be obtained at a rate of 3.6 KHz or higher. Each of the mains voltage samples, the mains current samples, and the branch current samples may be determined without consideration to either voltage or current polarity on the measured lines; i.e., subsequent processing of the current and voltage samples is independent of voltage and current polarity. Additionally, any line of the branch circuit may be utilized for measuring the branch circuit current.

At step 406, the mains voltage and mains current samples are utilized to update mains voltage and mains current signatures, respectively, for each mains phase, and the branch current samples are utilized to update a branch current signature. Such voltage and current signatures characterize the mains voltage, mains current, and branch circuit current over time. In some embodiments, each of the signatures is periodically updated every few line cycles, such as after every 5-10 line cycles. One or more of the signatures may be generated over time based on obtained voltage and/or current samples; alternatively, initial signatures may be provided and updated by collected voltage and/or current samples.

The method 400 proceeds to step 408, where it is determined whether there is a change in slope in the branch current signature sufficient to warrant further processing. A threshold for indicating a sufficient slope change may be determined by a bit resolution of an analog-to-digital (A/D) converter of a branch current sampler obtaining the branch circuit samples; e.g., the threshold may be determined by an amount of averaging of the signal performed prior to comparison and an amount of noise present in the signal. If, at step 408, it is determined that a sufficient slope change has not occurred, the method 400 returns to step 404. If, at step 408, it is determined that a sufficient slope change has occurred, the method 400 proceeds to step 410.

At step 410, the branch current signature is compared to each of the mains current signatures (i.e., the mains current signatures for each phase of the mains lines). As previously described, current changes on a branch circuit due to source or load activity result in changes to current levels on one or more of the mains current lines. Comparison of the branch and mains current signatures may include analyzing one or more of points of inflection in the signatures, time between points of inflection; slope between points of inflection, for example, sign, amplitude, and/or duration of changed slope, where duration of changed slope may be defined as the time duration of a straight line change in current (i.e., constant slope line) between two points of inflection; magnitude between points of inflection; or change in power factor around points of inflection; additional and/or alternative parameters may also be utilized.

At step 412, a determination is made whether there is a signature match (i.e., sufficient correlation) between the branch current signature and one or more of the mains current signatures. For example, current changes on a branch circuit coupled to a single phase load will be reflected in the mains current signature for the corresponding phase, while current changes on a branch circuit coupled to a three phase load will be reflected in each of the mains lines of a three phase power distribution system. If it is determined that no signature match exists, the method 400 returns to step 404. If at step 412 it is determined that a signature match exists, the method 400 proceeds to step 414.

At step 414, one or more source and/or load profiles may be utilized in determining whether the branch circuit comprises a source or a load (i.e., the circuit type), and the voltage characteristics of the branch circuit. Each source profile comprises one or more characteristics of a source, and each load profile comprises one or more characteristics of a load. Such source and load characteristics provide information pertaining to behavior of a source or a load at initial startup and/or during operation, For example, upon initial startup, a motor (i.e., a load) may pull on the order of five times it running current, resulting in an initial current spike which subsequently drops over the next few line cycles. Such a load characteristic may be utilized in determining that the branch circuit comprises a load. Additionally, the source and load characteristics of the source and load profiles may be utilized to determine a particular category of a source or a load, e.g., that a particular load is a motor load, a fluorescent lighting load, an incandescent lighting load, a heating load, or the like.

Voltage characteristics that may be determined for the branch circuit include the circuit voltage (e.g., operating voltage) and phase characteristics (e.g., single phase, split phase, three phase, or the like) as well as the mains lines connections (e.g., L1-N, L2-N, L1-L2, or the like). The source and load profiles utilized at step 414 may be learned over time, pre-stored, generated on demand, and/or obtained from an external source.

The branch current signature may additionally be compared to the each of the mains voltage signatures to correlate changes in the branch current signature and the mains voltage signatures. Significant changes in a load or in power generation on the branch circuit may result in a corresponding change in the mains voltage; generally such voltage changes may be small as compared to the mains voltage level (e.g., in a range of one volt change). The branch current signature may be compared to the mains voltage signatures by analyzing one or more of points of inflection in the signatures, time between points of inflection; slope between points of inflection, for example, sign, amplitude, and/or duration of changed slope, where duration of changed slope may be defined as the time duration of a straight line change in current (i.e., constant slope line) between two points of inflection; magnitude between points of inflection; or change in power factor around points of inflection; additional and/or alternative parameters may also be utilized. Such correlation of the branch current signature and the mains voltage signatures may provide a long-term verification of the mains lines connections and a confirmation of the load/source determination.

By automatically determining circuit type and voltage characteristics of the power user's branch circuits, the CMU can accordingly monitor relevant electrical parameters of the branch circuits and the mains lines without regard to orientation and polarity (i.e., without regard to the orientation and polarity of CMU leads coupled to the branch circuits and the mains lines). Additionally, information pertaining to power usage and/or generation on a per-branch circuit basis can be provided to the power user for determining power generation and/or consumption patterns. Such information may be provided, for example, as part of reports generated and sent to the power user, or via an on-line system that the power user may log into.

The method 400 proceeds to step 416, where a determination is made whether to continue. If the result of such determination is yes, the method 400 returns to step 404; if the result of such determination is no, the method 400 proceeds to step 418 where it ends.

Figure 5:
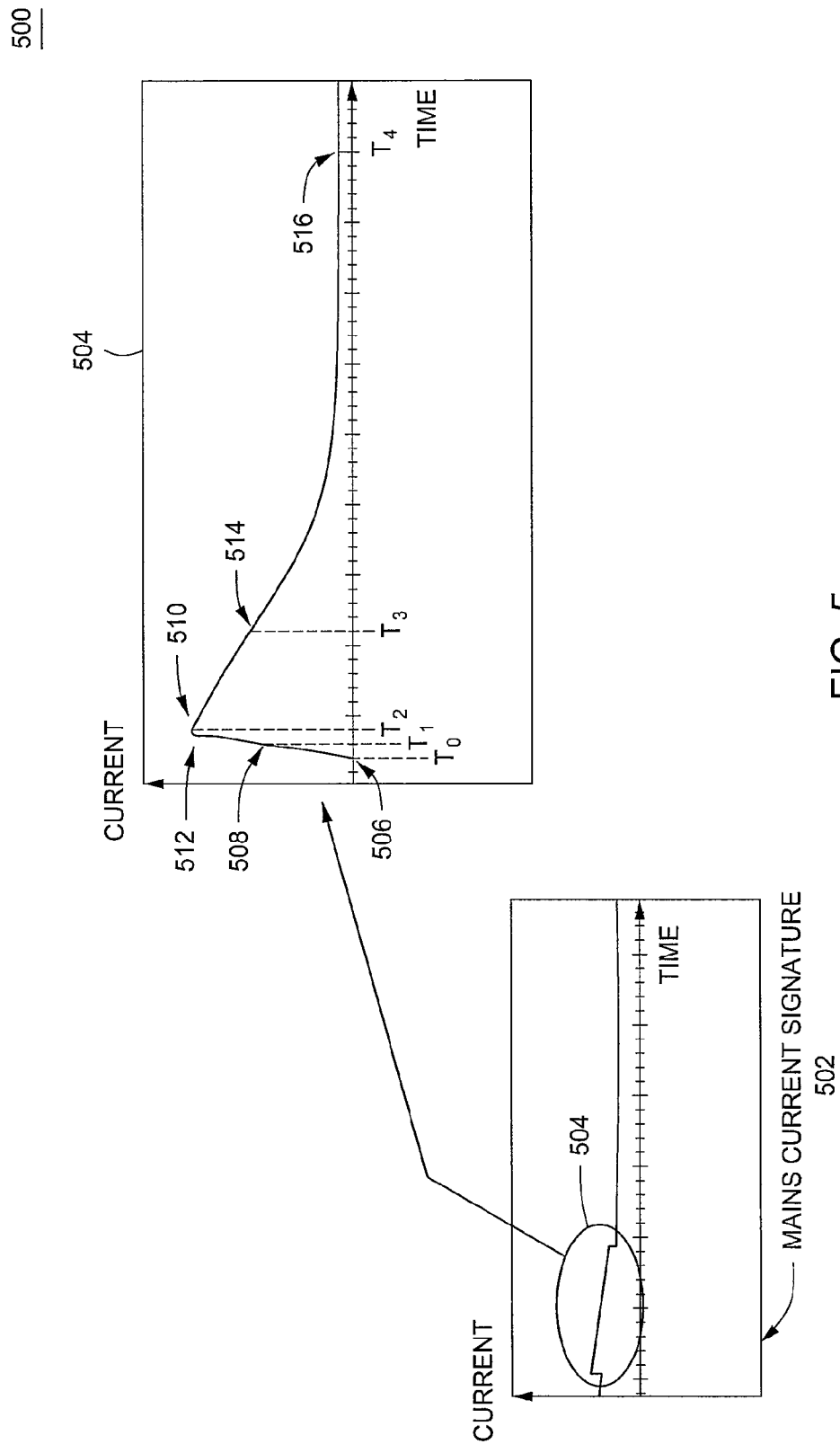
FIG. 5 is a pair of graphical diagrams depicting a mains current signature and a close-up view of a portion of the mains current signature in accordance with one or more embodiments of the present invention.

FIG. 5 is a pair of graphical diagrams 500 depicting a mains current signature 502 and a close-up view of a portion 504 of the mains current signature 502 in accordance with one or more embodiments of the present invention.

The mains current signature 502 and the mains current signature portion 504 depict the current measured on one mains phase (shown along the y-axis) over time (shown along the x-axis). The mains current signature portion 504 depicts changes in the mains current signature 502 resulting from an activation of a load (e.g., the start of a motor) coupled to the measured mains phase.

At time $T_0$, the mains current signature 502 experiences a first change in sign of the first derivative 506 due to the activation of the load. At time $T_1$, a first point of inflection 508 occurs as the current level rises rapidly to a peak value 510 and a second change in sign of the first derivative 512 at time $T_2$. At time $T_3$, a second point of inflection 514 occurs as the current level falls off, and at time $T_4$, the current level is at a steady state value 516.

As previously described, one or more of the changes in sign of the first derivative 506 and 512, the points of inflection 508 and 514, the peak value 510, and the steady state value 516 may be utilized in the comparison of a branch current signature to the mains current signature 502 for determining circuit type and/or voltage characteristics of the branch circuit.

While the foregoing is directed to embodiments of the present invention, other and further embodiments of the invention may be devised without departing from the basic scope thereof, and the scope thereof is determined by the claims that follow.

The invention claimed is:

1. Apparatus for characterizing a circuit coupled to an AC line, comprising:
   a consumption measurement unit, adapted for coupling, independent of voltage and current polarity, to the AC line and the circuit, comprising:
   a discovery module adapted for (i) generating a circuit current signature based on current samples representative of current on a phase of the circuit, (ii) generating at least one AC line current signature based on AC line current samples representative of current on each phase of the AC line, and (iii) determining, based on the circuit current signature, the at least one AC line current signature, and at least one of a source profile or a load profile, at least one of a type or a voltage characteristic for the circuit.

2. The apparatus of claim 1, wherein determining the at least one of the type or the voltage characteristic comprises:
   analyzing the circuit current signature to identify a change in slope;
   comparing the circuit current signature to the at least one AC line current signature to identify a signature match; and
   comparing the circuit current signature to the at least one of the source profile or the load profile.

3. The apparatus of claim 1, wherein the discovery module is further adapted for (iv) generating at least one AC line voltage signature based on AC line voltage samples representative of voltage on each phase of the AC line, and (v) comparing the circuit current signature to the at least one AC line voltage signature for at least one of confirming the type or verifying AC line phases coupled to the circuit.

4. The apparatus of claim 2, wherein the change in slope in the circuit current signature is identified when a slope of the circuit current signature satisfies a threshold.

5. The apparatus of claim 2, wherein comparing the circuit current signature to the at least one AC line current signature comprises analyzing at least one of points of inflection, time between points of inflection, slope between points of inflection, magnitude between points of inflection, or change in power factor proximate points of inflection.

6. The apparatus of claim 5, wherein analyzing the slope between points of inflection comprises analyzing at least one of a sign of the slope, an amplitude of the slope, or a duration of a change in slope.

7. The apparatus of claim 1, wherein the type is a source or a load.

8. The apparatus of claim 1, wherein the voltage characteristic identifies at least one of a voltage of the circuit, a single phase circuit, a split phase circuit, a three phase circuit, or AC line phases coupled to the circuit.

9. A method for characterizing a circuit coupled to an AC line, at least a portion of the method being performed by a controller comprising at least one processor, the method comprising:
   generating a circuit current signature based on circuit current samples representative of current on a phase of the circuit;
   generating at least one AC line current signature based on AC line current samples representative of current on each phase of the AC line; and
   determining, independent of polarity of both the circuit current samples and the AC line current samples, at least one of a type or a voltage characteristic for the circuit based on the circuit current signature, the at least one AC line current signature, and at least one of a source profile or a load profile.

10. The method of claim 9, wherein determining the at least one of the type or the voltage characteristic comprises:
   analyzing the circuit current signature to identify a change in slope;
   comparing the circuit current signature to the at least one AC line current signature to identify a signature match; and
   comparing the circuit current signature to the at least one of the source profile or the load profile.

11. The method of claim 9, further comprising:
   generating at least one AC line voltage signature based on AC line voltage samples representative of voltage on each phase of the AC line; and
   determining, independent of polarity of both the circuit current samples and the AC line voltage samples, at least one of a confirmation of the type or a verification of AC line phases coupled to the circuit based on the circuit current signature and the at least one AC line voltage signature.

12. The method of claim 10, wherein the change in slope is identified when a slope of the circuit current signature satisfies a threshold.

13. The method of claim 10, wherein comparing the circuit current signature to the at least one AC line current signature comprises analyzing at least one of points of inflection, time between points of inflection, slope between points of inflection, magnitude between points of inflection, or change in power factor proximate points of inflection.

14. The method of claim 13, wherein analyzing the slope between points of inflection comprises analyzing at least one of a sign of the slope, an amplitude of the slope, or a duration of a change in slope.

15. The method of claim 9, wherein the type is a source or a load.

16. The method of claim 9, wherein the voltage characteristic identifies at least one of a voltage of the circuit, a single phase circuit, a split phase circuit, a three phase circuit, or AC line phases coupled to the circuit.

17. Apparatus for characterizing a circuit coupled to an AC line, comprising:
   means for generating a circuit current signature based on circuit current samples representative of current on a phase of the circuit;
   means for generating at least one AC line current signature based on AC line current samples representative of current on each phase of the AC line; and
   means for determining, independent of polarity of both the circuit current samples and the AC line current samples, at least one of a type or a voltage characteristic for the circuit based on the circuit current signature, the at least one AC line current signature, and at least one of a source profile or a load profile.

18. The apparatus of claim 17, wherein the means for determining the at least one of the type or the voltage characteristic comprises:
   means for analyzing the circuit current signature to identify a change in slope;
   means for comparing the circuit current signature to the at least one AC line current signature to identify a signature match; and
   means for comparing the circuit current signature to the at least one of the source profile or the load profile.

19. The apparatus of claim 17, further comprising:
   means for generating at least one AC line voltage signature based on AC line voltage samples representative of voltage on each phase of the AC line; and
   means for determining, independent of polarity of both the circuit current samples and the AC line voltage samples, at least one of a confirmation of the type or a verification of AC line phases coupled to the circuit based on the circuit current signature and the at least one AC line voltage signature.

20. The apparatus of claim 17, wherein the type is a source or a load and the voltage characteristic identifies at least one of a voltage of the circuit, a single phase circuit, a split phase circuit, a three phase circuit, or AC line phases coupled to the circuit.

* * * * *